United States Patent
VanWiggeren et al.

(10) Patent No.: US 7,801,505 B2
(45) Date of Patent: Sep. 21, 2010

(54) MULTIPULSE/MULTITONE MIXING RECEIVER

(75) Inventors: Gregory Douglas VanWiggeren, San Jose, CA (US); Rory Van Tuyl, Los Altos, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 589 days.

(21) Appl. No.: 11/848,114

(22) Filed: Aug. 30, 2007

(65) Prior Publication Data

US 2009/0061812 A1    Mar. 5, 2009

(51) Int. Cl.
*H04B 1/26* (2006.01)
(52) U.S. Cl. ............... 455/323; 455/326; 455/196.1
(58) Field of Classification Search ........ 455/323, 455/326, 196.1, 208, 255, 259, 318, 67.11, 455/67.14, 114.1, 115.1; 324/612, 623
See application file for complete search history.

(56) References Cited

U.S. PATENT DOCUMENTS

| | | | | |
|---|---|---|---|---|
| 4,361,804 A | * | 11/1982 | Arnold | 324/76.45 |
| 5,089,782 A | * | 2/1992 | Pike et al. | 324/623 |
| 5,119,035 A | * | 6/1992 | Goy et al. | 324/639 |
| 6,690,247 B2 | * | 2/2004 | Kintis et al. | 333/20 |
| 7,071,852 B1 | * | 7/2006 | Wegener | 341/61 |
| 7,219,037 B2 | * | 5/2007 | Pupalaikis et al. | 702/189 |
| 2009/0216468 A1 | * | 8/2009 | Anderson | 702/57 |

OTHER PUBLICATIONS

The Microwave Transition Analyzer: A New Instrument Architecture for Component and Signal Analysis David J. Ballo and John A. Wendler—HP Journal, Oct. 1992, p. 48-62.

* cited by examiner

*Primary Examiner*—Sonny Trinh (57) ABSTRACT

An apparatus adapted for measuring the properties of periodic signals and a method for making such measurements is disclosed. The apparatus includes a LO signal generator, a mixer, a low pass filter and an output device. The LO signal generator generates an LO signal comprising a fundamental frequency $\omega_{LO}$ and one or more higher harmonics with arbitrary amplitudes and phases. The mixer receives a periodic input signal having harmonics including a highest harmonic of interest, N, and a fundamental frequency, $\omega_{in}$. The mixer outputs an IF signal that is filtered. The filtered IF signal includes a frequency-compressed signal having M harmonics including a fundamental characterized by a frequency $\omega_c < \omega_{in}$. Each of the harmonics in the frequency-compressed signal corresponds to one of the harmonics in the input signal and has an amplitude related to the amplitude of the corresponding harmonic in the input signal.

24 Claims, 7 Drawing Sheets

MULTIPULSE/MULTITONE MIXING RECEIVER

BACKGROUND OF THE INVENTION

Many signals of interest have bandwidths that are much larger than the bandwidth of the test equipment that must be utilized to measure the signals. For example, the bandwidth of a conventional oscilloscope is significantly less than that of many RF signals used in communication systems and the like. Hence, measuring such signals on an oscilloscope presents a problem. A sampling oscilloscope circumvents this problem for repetitive signals by utilizing a sampling circuit that measures the signal over a very brief time interval and displays the resulting sample as one point of a graph. Typically, one sample is taken during each period of the repetitive signal. The time of the sample relative to the beginning of the signal repetition is varied in each period such that successive points sample the signal at different points relative to the beginning of each period of the signal. Hence, the collection of samples can be displayed to provide a conventional display of voltage as a function of time.

Only a small fraction of the energy in the signal is extracted at each sample. The amount of energy that is extracted depends on the time interval over which the sampling window is opened. The sampling window must be of sufficiently short duration that changes in the signal amplitude during the sampling interval can be ignored. Hence, as the bandwidth of the signal being measured increases, the sampling time interval must be decreased, leading to still further decreases in the amount of energy that is extracted from the signal. The ratio of this sample energy to the noise in the instrument determines the signal-to-noise ratio of the instrument. Higher signal-to-noise ratios provide more accurate measurements, and hence, are preferred.

One possible method for increasing the signal-to-noise ratio of the sampled system is to increase the repetition rate of the sampling. However, an increase in the sampling rate is not always practical, because the electronics following the sampler also have bandwidth limitations.

Another method for improving the amount of energy extracted from the signal is to utilize a mixer in which a sinusoidal local oscillator signal is used to extract energy from the signal. However, this approach is only practical for signals having limited bandwidth such as a modulated RF carrier in which the carrier is removed so that the modulation waveform can be examined.

SUMMARY OF THE INVENTION

The present invention includes an apparatus adapted for measuring the properties of periodic signals and a method for making such measurements. The apparatus includes a LO signal generator, a mixer, a low pass filter and an output device. The LO signal generator generates an LO signal comprising a fundamental frequency $\omega_{LO}$ and one or more higher harmonics with arbitrary amplitudes and phases. The mixer has a first port that receives a periodic input signal having harmonics, including a highest harmonic of interest N, a fundamental characterized by a frequency, $\omega_{in}$, and one or more higher harmonics, each of the harmonics being characterized by an amplitude and phase. The mixer also includes a local oscillator port that receives the LO signal and an output port that provides an IF signal. The low pass filter filters the IF signal to generate a filtered IF signal. The output device outputs a signal related to the filtered IF signal to a device external to the apparatus. The filtered IF signal includes a frequency-compressed signal having at least N harmonics including a fundamental characterized by a frequency $\omega_c < \omega_{in}$. Each of the harmonics in the frequency-compressed signal corresponds to one of the harmonics in the input signal and has an amplitude and phase related to the amplitude and phase of the corresponding harmonic in the input signal. In one aspect of the invention, the low pass filter is characterized by cutoff frequency C and $N\omega_c < C$. In another aspect of the invention, the apparatus includes a data processor that computes a Fourier transform of the filtered IF signal and determines the amplitude of one of the harmonics in the input signal. In yet another aspect of the invention, the data processor generates a digital replica of the input signal and outputs that replica to a device external to the apparatus. In a still further aspect of the invention, the LO signal includes a multi-pulse signal.

DETAILED DESCRIPTION OF THE PREFERRED EMBODIMENTS OF THE INVENTION

Figure 1:
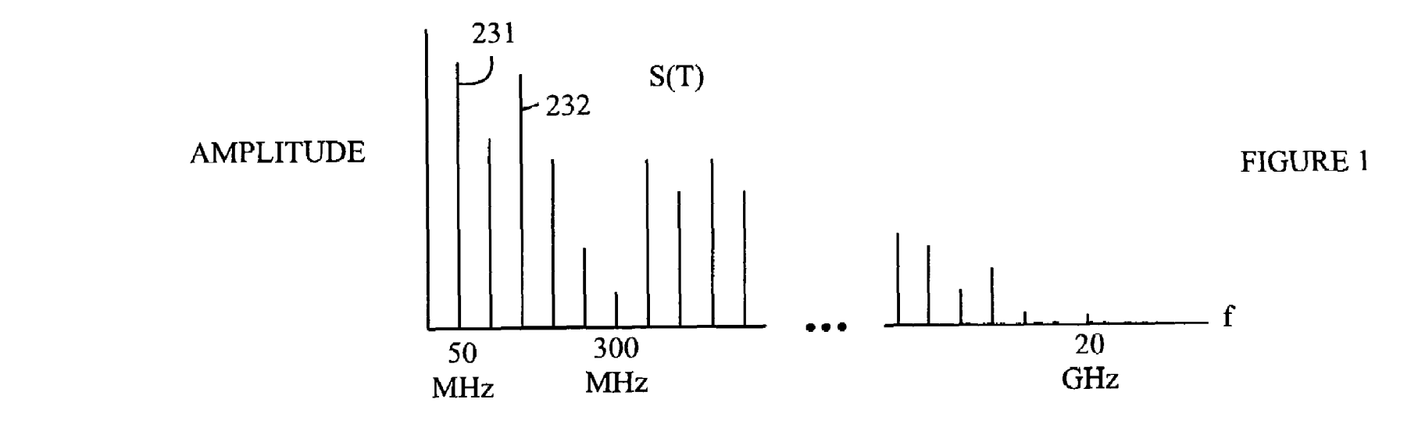
FIG. 1 illustrates the frequency spectrum of periodic signal.

The manner in which the present invention provides its advantages can be more easily understood with reference to FIG. 1, which illustrates the frequency spectrum of a periodic unknown signal S(t) having a fundamental frequency of 50 MHz and 400 harmonics. The spectrum consists of 400 peaks at frequency intervals of 50 MHz.

In many applications of interest, the goal is to compute the amplitude and phase of the various harmonics. In principle, the harmonics could be obtained by digitizing the signal and performing a Fourier transform on the digitized signal. However, this strategy requires a system for sampling the signal at a frequency that is at least twice the frequency of the bandwidth of the signal. Such high-frequency sampling is not possible in many situations.

Figure 2:
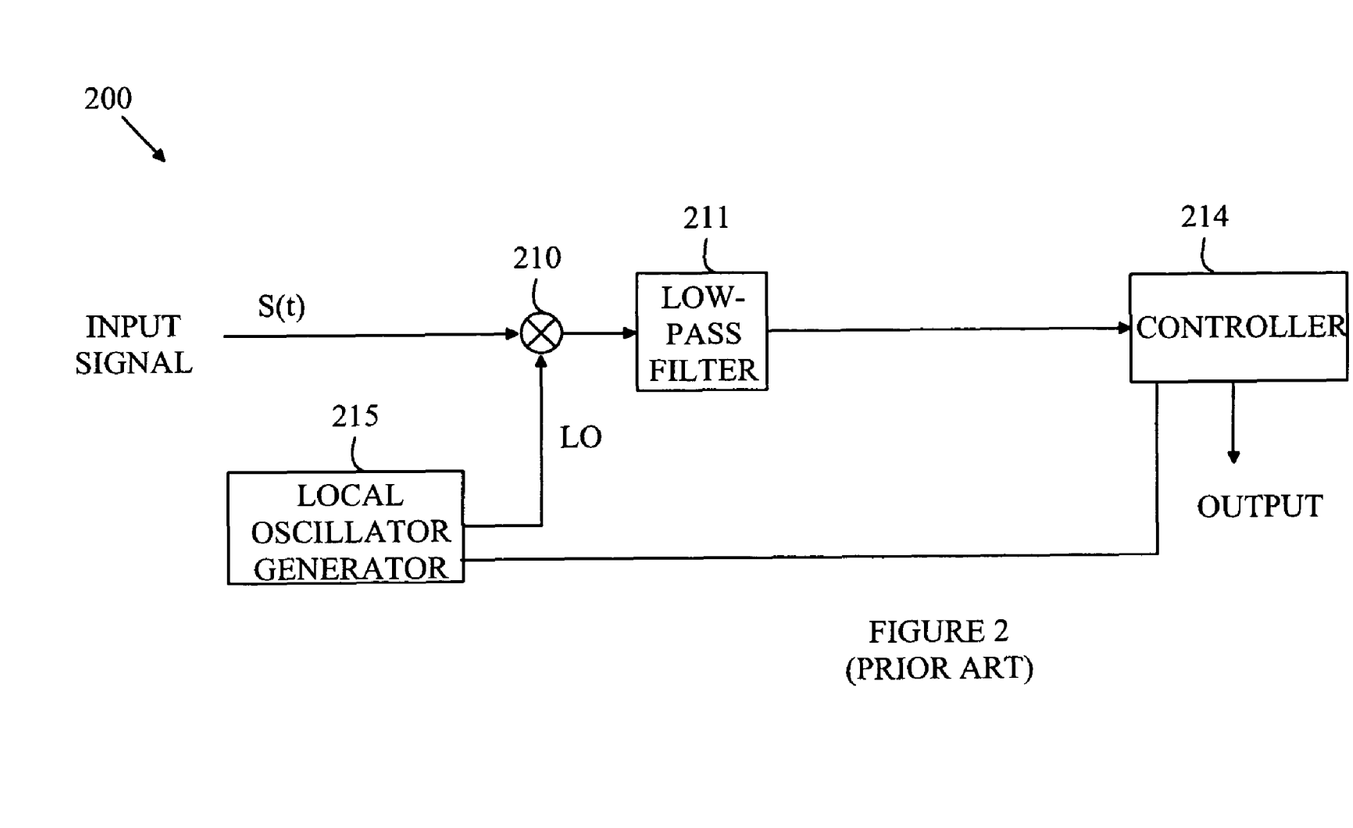
FIG. 2 illustrates a prior art receiver.

A receiver that utilizes such a mixing strategy is shown in FIG. 2. To measure the first harmonic at 50 MHz, an LO(t) signal having a frequency near 50 MHz, say 49 MHz is introduced into one port of 210 mixer by generator 215 and S(t) is introduced into the other port. The output of mixer 210 contains all of the cross products of S(t) and LO(t). In particular, the output of the mixer contains a signal having a frequency at 1 MHz. The amplitude of this signal is proportional to the amplitude of the 50 MHz harmonic of S(t). The output of the mixer also has a large number of other frequency components at frequencies that are higher than 50 MHz. A low pass filter 211 rejects these higher frequency components; hence, the output of the low pass filter is a sine wave having a frequency of 1 MHz and an amplitude that is proportional to the amplitude of the 50 MHz harmonic and can be measured by controller 214. After this harmonic has been measured, the frequency of the LO signal is changed to a frequency near the second harmonic at 100 MHz and the procedure repeated, and so on. Hence, to measure the entire frequency spectrum of S(t) over the harmonics of interest, 400 separate measurements must be made.

If one were to attempt to measure a device under test at 400 frequency points spanning 20 Ghz with a conventional network analyzer based on the receiver of FIG. 2, one would need to sweep two oscillators together through the frequency range. The first oscillator is used to apply a test signal to the device under test and the second oscillator is the LO of the mixer in the network analyzer. Sweeping both oscillators in a synchronized manner, or stepping both oscillators through 400 discrete steps limits the speed of measurement.

In addition, in many applications, the relative phases of the harmonics in the input signal must also be measured. To provide this information, the relative phases of the different LO signals used to measure each harmonic must also be known. This further complicates the measurement of S(t) and increases the cost of the instrument.

Figure 3:
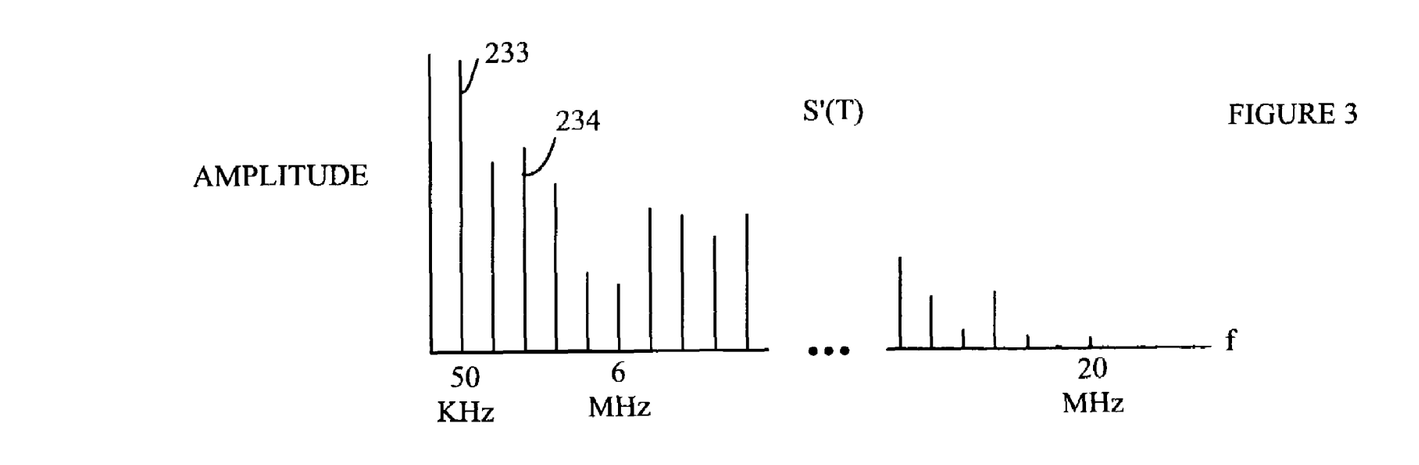
FIG. 3 illustrates the frequency components for the compressed signal S'(t) generated from the periodic signal shown in FIG. 1.

The present invention avoids this step-by-step process. In effect, the present invention transforms S(t) to a new frequency-compressed signal S'(t) having a bandwidth that is sufficiently limited to allow S'(t) to be digitized and Fourier transformed to obtain the frequency domain information of S(t) without requiring that the individual frequency components in S(t) be separately measured. Refer again to FIG. 1 and to FIG. 3, which illustrate the frequency components for the compressed signal S'(t). The original signal, S(t) is again assumed to have a fundamental frequency of 50 MHz as shown at 231 and 400 harmonics of interest. The highest harmonic of S(t) is at 20 GHz. The transformed signal, S'(t), also has 400 harmonics; however, the fundamental of the transformed signal is 50 KHz as shown at 233, and hence, the $400^{th}$ harmonic is only at a frequency 20 MHz. The transformed signal has one harmonic corresponding to each harmonic in S(t). For example, the harmonic in S'(t) corresponding to harmonic 232 in S(t) is shown at 234. Finally, as will be explained in more detail below, the relationship between the amplitudes and phases of the harmonics of S'(t) and the corresponding amplitudes and phases of the harmonics in S(t) can be determined, and hence, given the measured values for the amplitudes and phases of the harmonics of S'(t), the amplitude and phases of the harmonics of S(t) can be determined. As will be explained in more detail below, the bandwidth of S'(t) can be set such that S'(t) can be digitized and Fourier transformed using an inexpensive analog-to-digital converter and conventional computational hardware.

Figure 4:
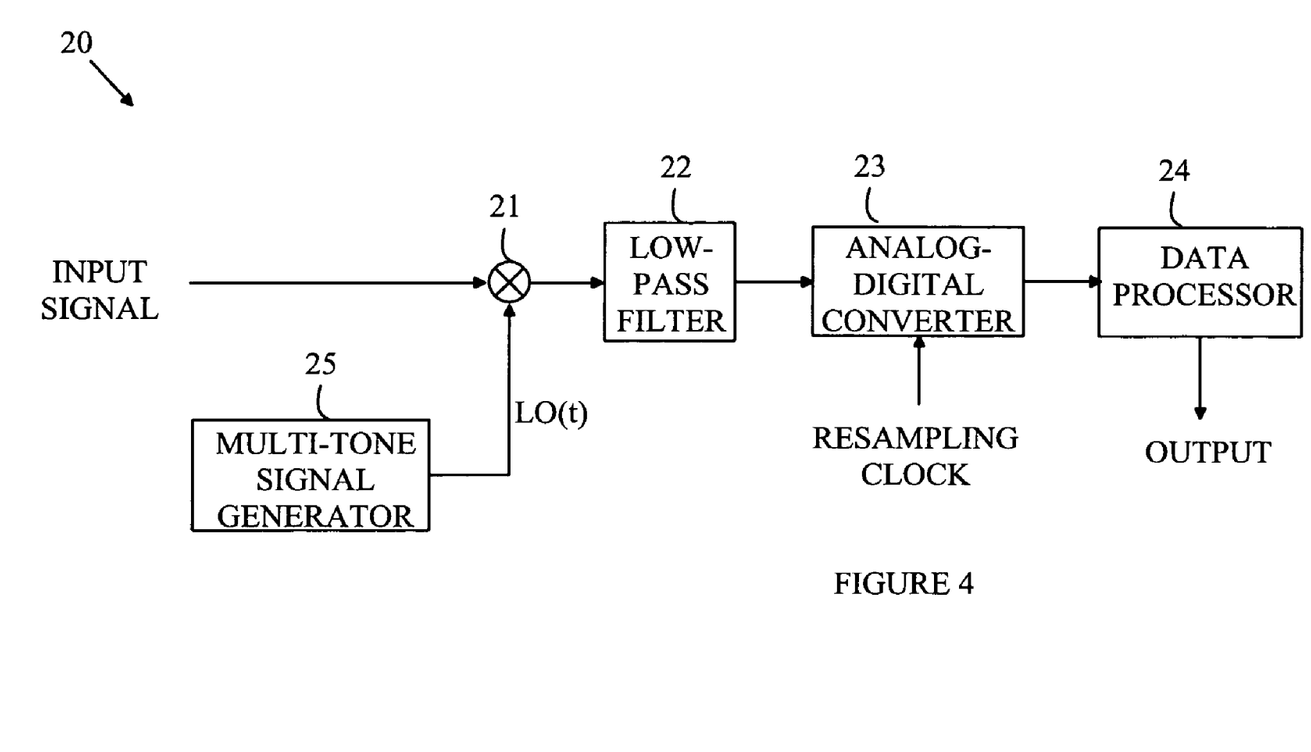
FIG. 4 illustrates one embodiment of a receiver according to the present invention.

The manner in which the present invention operates can be more easily understood with reference to FIG. 4, which illustrates one embodiment of a receiver with a multi-tone or multi-pulse local oscillator [LO] according to the present invention. The input signal to receiver 20 is mixed with a repetitive LO signal that will be discussed in more detail below. The output of mixer 21 is low pass filtered through filter 22 and digitized by analog-to-digital converter 23. The output of analog-to-digital converter 23 is processed by data processor 24 to produce a digitized replica of the input signal or measurements of the amplitude and phase of the input signal's frequency components. As will be explained in more detail below, the output of low pass filter 22 is S'(t) provided the LO signal from multi-tone or multi-pulse signal generator 25 is properly chosen.

Consider an input signal that is repetitive with a period of $T_{in}$. Assume that the output of multi-tone or multi-pulse signal generator 25 is also a repetitive signal of period $T_{LO}$ where $T_{LO}$ is slightly different from $T_{in}$. In this case both the input and LO signals can be represented as harmonic series of the form:

$$S(t) = \sum_k A_k e^{(jk\omega_{in}t+\varphi_k)}$$

$$LO(t) = \sum_k B_k e^{(jk\omega_{LO}t+\phi_k)}$$

Here, $j=\sqrt{-1}$, $\omega_{in}=2\pi/T_{in}$, $\omega_{LO}=2\pi/T_{LO}$, and the $\phi_k$ and $\varphi_k$ are the phases of the $k^{th}$ harmonics in the input signal and LO input, respectively. The output of mixer 21 contains all possible cross-products of S(t) and LO(t). In particular, S'(t) can be written in the form:

$$S'(t) = \sum_k B_k A_k e^{(jk\omega_C t+d\phi_k)} + \text{other frequency terms}$$

Here $\omega_c = |\omega_{in} - \omega_{LO}|$. Hence, S'(t) will include a harmonic having frequency $k\omega_c$ corresponding to the harmonic having frequency $k\omega_{in}$ in the input signal. Denote the frequency of highest harmonic of interest in the input signal by $N\omega_{in}$. It should be noted that each harmonic in the input signal will also be represented by other terms that have frequencies greater than $N\omega_c$. The unwanted higher frequency terms can be eliminated by low pass filter 22. In general, the cutoff frequency of low pass filter 22, C, is set such that $C > N\omega_c$. The upper limit on C is determined by the particular analog-to-digital converter used.

The signal, S'(t), can be viewed as a frequency-compressed version of S(t). The compression factor is $\omega_{in}/\omega_c$. All of the amplitude and phase information of each of the harmonics in the input signal can be obtained from the amplitude and phase of the corresponding harmonic in S'(t), provided the amplitudes and phase of the harmonics in the LO signal are known. The fundamental frequency of the frequency-compressed signal is $\omega_C$ and $d\phi_k$ is the phase of the $k^{th}$ harmonic of the frequency-compressed signal. The constants $B_k$ and the phases associated with the tones in the LO signal can be measured by applying a known input signal to the mixer and measuring the amplitude and phase of each harmonic in the compressed signal. Hence, the Fourier transform of the filter output can be used to obtain the amplitudes, $A_k$ and the phases, $\phi_k$ of S(t). The analog-to-digital converter needs to operate at a frequency that is sufficient to capture the frequency information in the filter output without significant aliasing of higher frequency signals. Hence, it must at least, sample the filter output at a frequency twice the cutoff frequency of the low pass filter. Since analog-to-digital converter 23 samples S'(t) more than once per period of the LO signal, analog-to-digital converter 23 captures more of the signal energy than a sampling scope. In addition, it should be noted that analog-to-digital converter 23 does not need to be synchronized to the LO signal.

The receiver of the present invention can be used with any repetitive signal. A number of specific examples will be discussed in the following examples. In the network analysis mode, the receiver can be utilized to test both digital and analog components, circuits and networks. One form of component testing involves measuring the response of the component to a periodic stimulus signal. In the simplest case, the DUT is a linear device, and hence, the signal leaving the DUT has the same frequency as the stimulus signal. In this case, the behavior of the DUT as a function of frequency can be measured with a conventional network analyzer by inputting a single tone to the DUT and measuring the output of the DUT at the frequency of the tone by using a network analyzer with an LO having a tone at a frequency that is close to that of the stimulus tone. The behavior of the DUT as a function of frequency can be obtained by sweeping the stimulus tone and the LO tone together. The time needed to sweep a large frequency range can be excessive. For example, the time to sweep 20 GHz can be greater than 100 ms. This prevents the user from observing time-varying S-parameters on timescales faster than tens or hundreds of ms.

In addition, a conventional network analyzer operating in swept mode has difficulty measuring DUTs that have large group delays for the signals passing therethrough. While these difficulties can be avoided by using an analyzer that steps the input signal frequency through discrete steps, the resultant measurement time is increased still further over that obtained in the swept mode, and hence, the observation of time varying S-parameters is further limited.

A receiver according to the present invention can be utilized to make such a measurement in a significantly shorter time period without the need to provide two swept frequency sources. For example, a multi-tone or multi-pulse signal having X harmonics can be applied to the DUT, and the output of the DUT is then input to a mixer according to the present invention. For simplicity, it will be assumed that the LO signal also has one harmonic corresponding to each harmonic in the stimulus signal. Then the output of the DUT is, in general, a multi-tone signal also having X harmonics. A receiver according to the present invention, generates a corresponding signal S'(t), whose spectrum is analyzed to provide the amplitude and phase of each of the N harmonics in S'(t). As noted above, this information can then be used to compute the amplitude and phase of each of the harmonics in the signal leaving the DUT.

Figure 5:
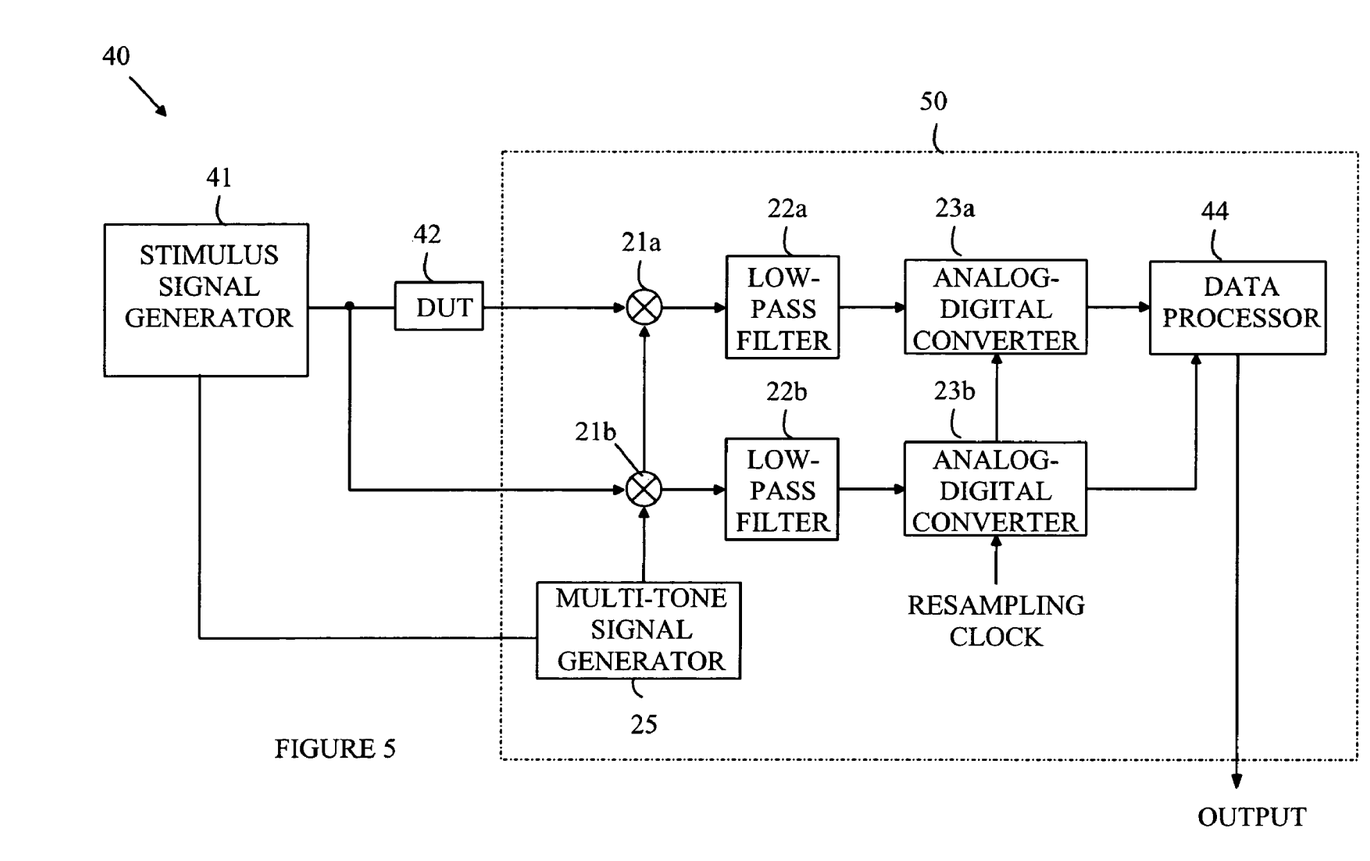
FIG. 5 illustrates one embodiment of a network analyzer according to the present invention.

In a network analyzer according to the present invention, a receiver according to the present invention is combined with a repetitive stimulus signal to provide a network analyzer that can operate at significantly higher acquisition speeds than the conventional network analyzers discussed above. Refer now to FIG. 5, which illustrates one embodiment of a network analyzer according to the present invention. Network analyzer 40 includes a stimulus generator that generates a repetitive signal having a fundamental frequency of $1/T_{in}$ and significant energy at each of a plurality of harmonics of the fundamental. This signal is applied to DUT 42. The output signal from DUT 42 is then analyzed in a receiver 50 according to the present invention. Receiver 50 includes a reference path comprising mixer 21b, low-pass filter 22b and analog-to-digital converter 23b that receives the stimulus signal directly. The signal from DUT 42 is analyzed by mixer 21a, low-pass filter 22a, and analog-to-digital converter 23a. Mixers 21a and 21b are identical to one another. Similarly low-pass filters 22a and 22b are identical to one another.

The local oscillator signal generated by multi-tone or multi-pulse signal generator 25 has a fundamental frequency that is slightly different from that of stimulus signal generator 41. The amplitudes and phases of the harmonics in the LO signal are known and the phases of the harmonics in the LO signal have a fixed relationship to the phases of the harmonics in the input signal. The fundamental frequencies are chosen such that each harmonic in the local oscillator frequency corresponds to one of the harmonics in the stimulus frequency.

The signal from mixer 21a that leaves low-pass filter 22a is digitized by analog-to-digital converter 23a. This signal is Fourier transformed by data processor 44 to a frequency-domain signal in a manner analogous to that discussed above. Hence, each peak in the Fourier spectrum represents a harmonic in the compressed signal. Similarly, the signal from analog-to-digital converter 22b is analyzed to provide a Fourier Transformed signal.

For example, the measurement of $S_{21}$ as a function of frequency for a DUT can be provided as follows. A stimulus signal having a fundamental frequency of 50 MHz and a 400 harmonics having significant power is generated for the stimulus signal. The LO signal having a fundamental frequency of 50.05 MHz and 400 corresponding harmonics is provided by multi-tone or multi-pulse signal generator 25. At 20 GHz, i.e., the $400^{th}$ harmonic, the corresponding tones in the stimulus and LO signals differ by 20 MHz. Hence, if low pass filters have a 25 MHz cutoff, a signal representing each of the 400 harmonics will appear in the output of low pass filter 22. This Fourier transform of the IF signal will have a frequency peak every 0.05 MHz from 0.05 MHz to 25 MHz. The first peak corresponds to the stimulus signal harmonic at 50 MHz, the second peak to the component at 100 MHz, and so on. Denote the peaks in the Fourier Transform of the reference signal from analog-to-digital converter 23b by $IF_R(f_k)$, for k=1 to X and the peaks in the Fourier Transform of the signal from analog-to-digital converter 23a by $IF_D(f_k)$, for k=1 to X, then $S_{21}(f_k)=IF_D(f_k)/IF_R(f_k)$, where $S_{21}(f_1)$ is $S_{21}$ at 50 MHz, $S_{21}(f_2)$ is $S_{21}$ at 100 MHz, and so on.

The above example assumes that the mixers are identical and differences in cables and signal paths can be ignored. If this is not the case, the effects of differences in the two signal paths can be calibrated and eliminated by making a second set of calibration measurements with the DUT replaced by a calibration standard.

The time required to make the measurement in question depends on the speed of analog-to-digital converter 23. An inexpensive analog-to-digital converter runs at 100 Msamples/sec with up to 16 bits resolution. Hence, to acquire 512 frequency measurements over the IF band requires only about 10 microseconds. The equivalent measurement with a conventional network analyzer requires about 100 ms. The speed advantage arises from the fact that the multi-tone LO signal enables the frequency spectrum to be sampled over a wide range without having to sweep an oscillator through a 20 GHz range.

A receiver according to the present invention can also be utilized to construct a sampling oscilloscope. Real-time oscilloscopes are too slow to measure signals at very high frequencies. The bandwidth of such oscilloscopes is limited to less than half the sampling rate of the analog-to-digital converter employed in the oscilloscope. Hence, while such oscilloscopes can measure arbitrary waveforms, they are not usable for very high frequency signals. Sampling oscilloscopes can be used for very high frequency signals provided the signals are repetitive. Sampling oscilloscopes sample the input signal at intervals that are displaced from the beginning of the repetitive waveform being measured. In the simplest case, the signal is sampled once each period of the repetitive signal. If the period of the repetitive signal is T, the signal is sampled at T+kt, where k is an integer that runs from 0 to $N_p-1$. Hence, if the signal is to be measured at $N_p$ points with one point being measured per period, then $t=T/N_p$, and the time to generate a digital replica of the signal is $N_pT$. In principle, the measurement time can be reduced by measuring more than one point per period of the unknown signal.

Figure 6:
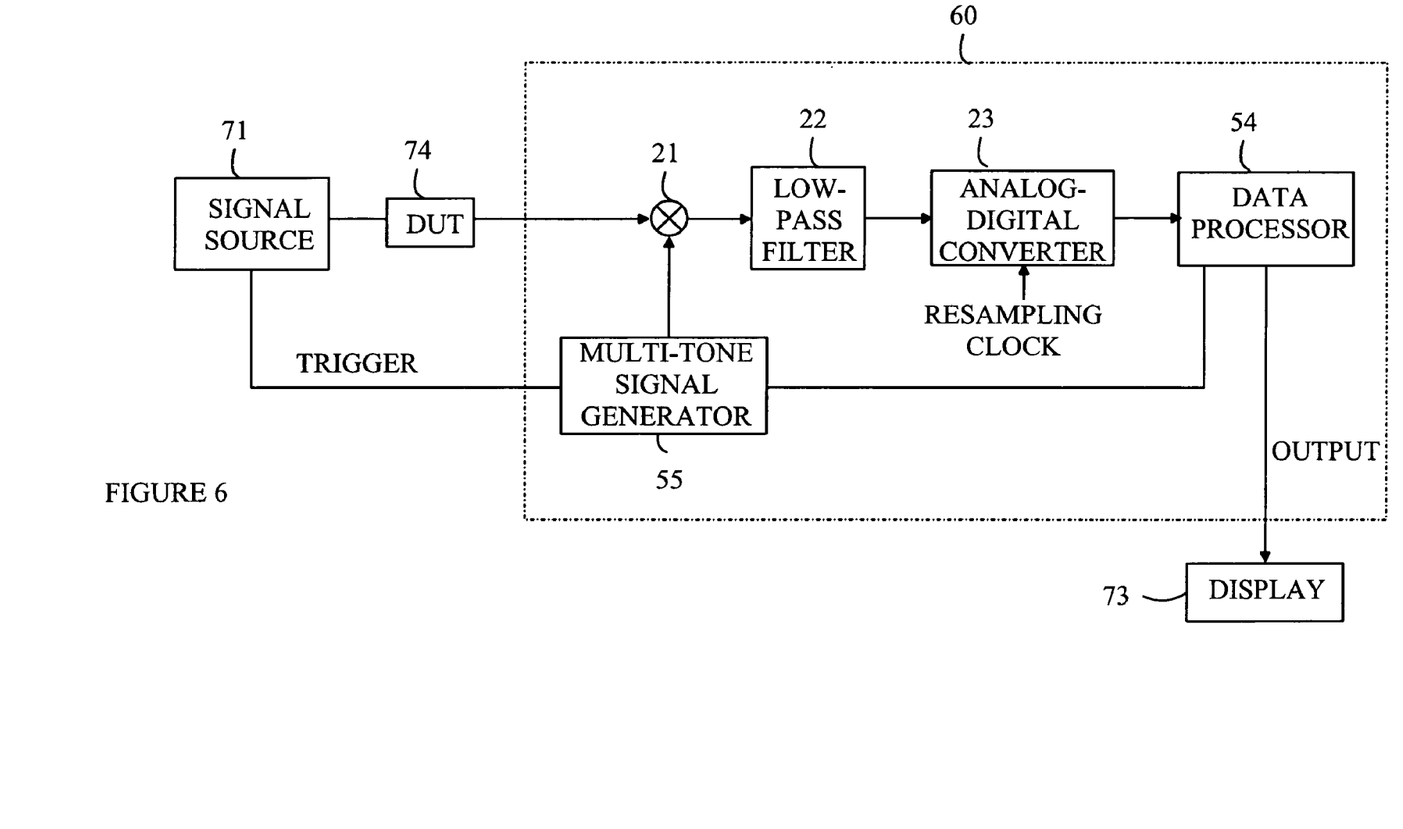
FIG. 6 illustrates one embodiment of a sampling oscilloscope according to the present invention.

Refer now to FIG. 6, which illustrates one embodiment of a sampling oscilloscope 60 according to the present invention. Sampling oscilloscope 60 generates an output, which is a digital replica of the signal input from source 71. The output can be displayed on a display such as display device 73 or used as input to another data processing system. In general, the signal source provides some form of trigger that is synchronized with the repetitive waveform generated by signal source 71. For the purposes of this discussion, it will be assumed that the signal is applied to a DUT 74 and the output of DUT 74 is to be displayed on display 73.

Denote the period of the repetitive waveform from signal source 71 by $T_s$. The signal from DUT 74 will also be repetitive with period $T_s$ and can be represented by a harmonic series. Once again, it will be assumed that the signal from DUT 74 is bandwidth limited, i.e., there is some number of harmonics, X, such that the frequency band below $X\omega_{in}$ includes essentially all of the energy in this signal. The amplitude and phases of these X harmonics are measured by sampling oscilloscope 60 and used to construct a replica of the signal from DUT 74 by means of an inverse Fourier transformation. Since the purpose of a sampling oscilloscope is to recreate the input signal, X is typically equal to the highest harmonic of interest, N.

To provide the measurements of the amplitude and phase of these X harmonics, multi-tone or multi-pulse signal generator 55 must generate an LO signal that has a harmonic that is sufficiently close to each of the X harmonics such that their mixing product falls within the bandwidth C of the low pass filter. In addition, the phases and amplitudes of the X harmonics S(t) must be obtainable from the phases of S'(t). As will be discussed in more detail below, the phases of the tones in the LO signal are locked with respect to one another. Hence, the output of analog-to-digital converter 23 will include both the phase and amplitude information needed to determine the phase and amplitude of the harmonics in the input signal. Hence, a replica of the input can be provided by an inverse Fourier transform generated by data processor 54.

The above-described embodiments of the present invention utilize a multi-tone or multi-pulse signal generator that provides a repetitive signal having the desired harmonics. In general, the amplitude of the harmonics must be controllable, since amplitude of each frequency component from the mixer is proportional to the amplitude of a corresponding harmonic in the multi-tone signal. In addition, at least one harmonic of the LO signal must be sufficiently close to each harmonic in the input signal that the frequency of their mixing product falls within the available bandwidth C of the lowpass filter.

Figure 7:
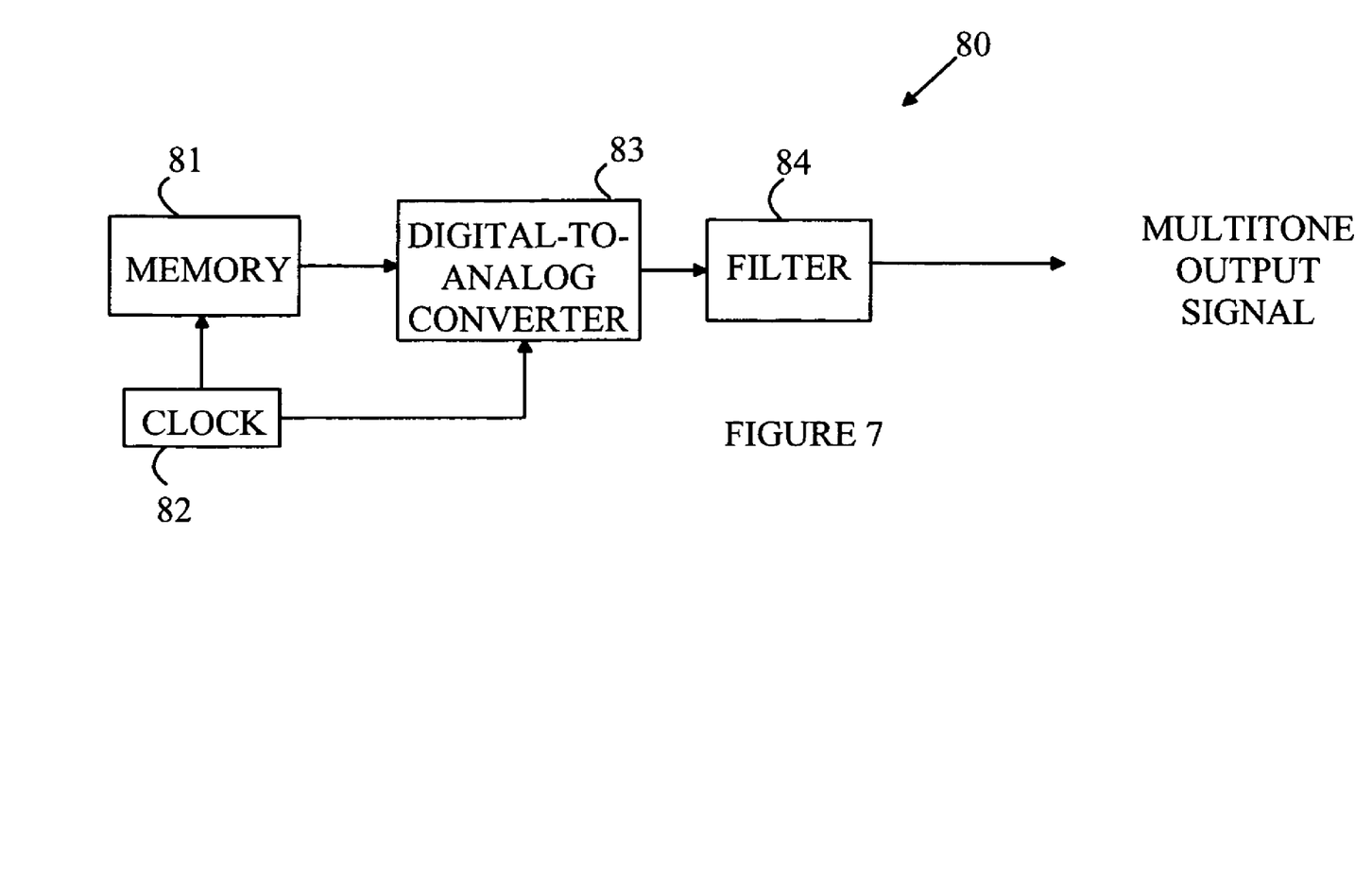
FIG. 7 illustrates one embodiment of a multi-tone signal generator.

A multi-tone signal of the desired frequency spectrum and phase relationships could be synthesized digitally by generating each sine wave numerically and mathematically adding the individual sine waves with the desired amplitudes and phases. Refer now to FIG. 7, which illustrates a multi-tone signal generator that utilizes this approach. The numerically generated digital signal is stored in a memory 81 as a sequence of amplitudes, the address of each amplitude specifies the order in which the value is to be read out of the memory. The address of the memory is supplied by a clock 82 that sequentially updates the address register in memory 81 and causes the value stored at the location specified by the address to be outputted to digital-to-analog converter 83. The clock also triggers digital-to-analog converter 83 causing the digital-to-analog converter to output a voltage specified by digital input thereto. The output of digital-to-analog converter 83 is then filtered by filter 84 to smooth out the steps in the output of digital-to-analog converter 83. By adjusting the clock time period, a repetitive signal of the desired period can be obtained.

Unfortunately, to provide a multi-tone signal with harmonics in the tens of GHz, the digital-to-analog converter must be capable of converting values at a rate of tens of GHz. Digital-to-analog converters having such high conversion rates are either not available or too costly for many applications of interest. Hence, at very high frequencies a different form of multi-tone signal generator is preferred.

Figure 8:
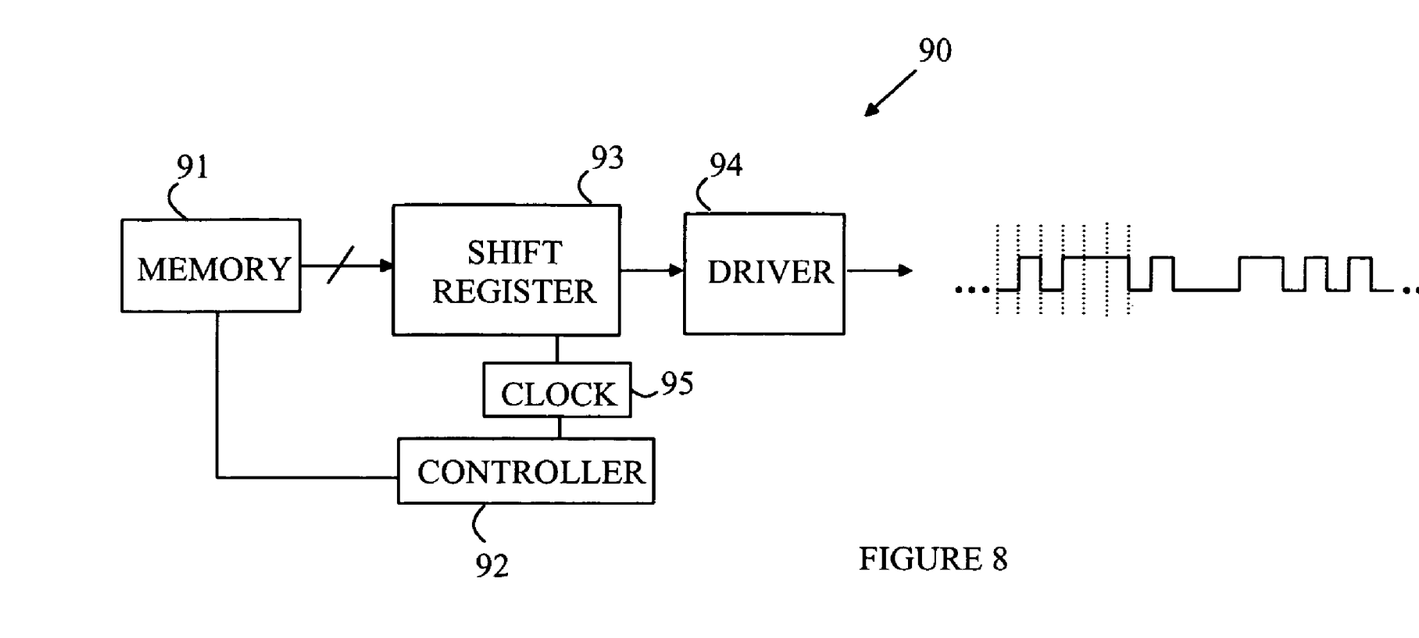
FIG. 8 illustrates one embodiment of a multi-pulse signal generator.

One type of signal that can be generated digitally at rates significantly above those obtainable using digital-to-analog converters is a multi-pulse signal generator. The multi-pulse signal generator produces a repetitive waveform of period $T_{LO}$ consisting of a binary signal that switches between two voltages, V1 and V2 multiple times in the period $T_{LO}$. For the purposes of this discussion, a multi-pulse signal is defined to be a signal that takes on one of two voltages at any given time except for the times at which the signal is transitioning between these two values. Refer now to FIG. 8, which illustrates one embodiment of a multi-pulse signal generator 90 for use in the present invention. The multi-pulse signal is specified by a sequence of bits that are stored in a memory 91. To improve the speed of the multi-pulse signal generator, the sequence is divided into multi-bit words within memory 91. Each word is transferred in parallel to a high-speed multiplexer 93 when the previous contents of the multiplexer have been read out. At each clock pulse, the multiplexer 93 selects the next bit of the parallel input word in sequence, and transfers it to the multiplexer output. The output of the multiplexer 93 forms the input to a driver 94 that converts the binary value to a voltage, a binary 0 being converted to V1 and a binary 1 being converted to V2. In the embodiment shown in FIG. 8, the multiplexer is implemented via a shift register that is shifted on each clock cycle from clock 95 that is under the control of controller 92.

The maximum speed of multi-pulse signal generator 90 is determined by the rate at which bits can be read out of multiplexer 93. Multiplexers that operate at tens of GHz are commonly used in telecommunication switches; hence, a multi-pulse signal generator can be constructed at a relatively low cost while still providing signals with harmonics in the tens of GHz. Since this rate is significantly higher than the rate at which digital-to-analog converters can operate, the multi-pulse signal generator allows the multi-tone mixer of the present invention to operate at higher signal input frequencies than would be possible with a conventional multi-tone signal.

It should be noted that a multi-pulse signal differs from a single-pulse signal in the following way: a single-pulse signal produces a spectrum in which the fundamental frequency and all its harmonics have the same phase; a single-pulse signal produces a spectrum in which the fundamental frequency and all its harmonics have amplitudes that cannot be controlled; a multi-pulse signal can produce a spectrum with arbitrary amplitudes and phases. In this regard, the multi-pulse signal and the multi-tone signal are similar, they are both signals comprising a fundamental frequency and one or more higher harmonics with arbitrary amplitudes and phases.

It should be noted that the number of harmonics in a multi-pulse signal is determined by the number of bits in the binary sequence that determines the multi-pulse signal. The frequency of the harmonics is determined by the clock rate with which the bits are output. If the multi-pulse signal is clocked at a frequency f and has P pulses in the sequence, the fundamental frequency of the LO signal will be f/P. The specific pattern of bits determines the relative amplitudes and phases of the harmonics.

A number of techniques can be employed to generate such patterns. For example, assume that the desired amplitudes and phases of the various harmonics are known. Denote the amplitudes and phases by $B_k$ and $\phi_k$, respectively, for k=1 to M. A combined digital signal D(n) is given by $$D(n) = \sum_k B_k \sin(knt_o + \phi_k)$$

where n runs from 1 to Y, the number of points in one cycle of the multi-tone digital signal. Here, $t_0$ is a constant that is chosen to provide the desired frequency resolution in the combined signal. This digital signal is then converted to a multi-pulse signal, P(n) by setting P(n)=1 if D(n)>0 and P(n)=0 if D(n)≦0. The frequency spectrum of P(n) can be shown to be approximately that of D(n). The differences introduced by the approximation change the calibration constants described above.

In many cases, a specific relationship between the phases, $\phi_k$, is not required. If the multipulse signal is utilized to probe frequency response of the device as discussed above, then the individual harmonics in the multipulse signal are treated separately in the analysis, and hence, the specific phase relationships between the harmonics in the multipulse signal do not enter into the analysis. In this case, the phases can be chosen such that the multipulse signal has less energy in harmonics that are different from the harmonics of interest.

The above-described embodiments utilize a mixer configuration in which there is one harmonic in the LO signal for each harmonic of interest in the input signal. However, in the more general case, the number of harmonics in the LO signal can be considerably more or less than the number of harmonics of interest in the input signal.

Consider a case in which the input signal has a fundamental frequency of 1 MHz and 20,000 harmonics, i.e., the highest harmonic in the input signal is 20 GHz. Assume that the low pass filter has a cutoff frequency of 50 MHz. Consider an LO signal having a fundamental frequency of 40.001 MHz. The fundamental frequency will generate components of S'(t) with frequencies that correspond to the differences and sums of the harmonics of the input signal and 40.001 MHz. In particular, there will be frequency components in S'(t) at 39.001, 38.001, ..., 0.001 MHz corresponding to the harmonics at 1 MHz, 2 MHz, ... 40 MHz, respectively in the input signal and components at 41.001, 42.001, ..., 49.001 corresponding to the harmonics at 1 MHz, 2 MHz, ... 9 MHz in the input signal, respectively. The next harmonic in LO, 80.002 MHz, will generate frequency components at 49.002, 48.002, ..., 0.002 MHz corresponding to the input signal harmonics at 31 MHz, 32 MHz, ..., 80 MHz, respectively. Hence, it can be seen that each harmonic in the LO signal now generates a group of frequencies in the S'(t) signal. In addition, if the fundamental of the LO signal harmonics is correctly chosen, the group of frequencies generated by any given harmonic will be distinct from those generated by other harmonics in the LO signal.

To create a signal, S'(t), that has components corresponding to each of the harmonics of interest in the input signal, the harmonics in the LO signal must have certain properties. First, the harmonics of the LO signal should not have frequencies equal to any of the harmonics of interest in the input signal. If a harmonic in the input signal matches a harmonic in the LO signal, that harmonic will be lost, since the corresponding harmonic in S'(t) would have a frequency of zero. Second, the group of frequency components in S'(t) generated by the $k^{th}$ harmonic in the LO signal must have frequencies that differ from the group of harmonics generated by the $j^{th}$ harmonic in the LO signal for values of k and j that are different from one another. These constraints will be satisfied if $i\omega_{LO} \ne j\omega_{in}$ for i=1 to M, and j=1 to X, where $X\omega_{in}$ is the frequency of the highest non-negligible harmonic in the input signal, and $M\omega_{LO}$ is the frequency of the highest harmonic in the LO signal. It should be noted that $\omega_c$ is the minimum value of $|i\omega_{LO}-j\omega_{in}|$ for i and j in the above defined ranges if this constraint is satisfied.

The above-described embodiments depend on a low pass filter that rejects the high frequency mixing products that are produced by the mixer. The cut-off frequency of this filter must be sufficient to allow the frequency components of S'(t) to be transmitted to the analog-to-digital converter. However, filters with larger pass bands could be utilized. A larger pass band reduces the number of harmonics in the LO signal that must be utilized to assure that all of the harmonics of interest in the input signal are represented in S'(t). Hence, larger pass bands have advantages in some applications. However, there is a tradeoff between the pass band of the filter and the cost of the analog-to-digital converter. The analog-to-digital converter must be able to sample the signal leaving the filter at a frequency equal to twice the pass band of the filter; hence, a larger pass band requires a faster analog-to-digital converter. If the pass band is too great, the cost of the analog-to-digital converter becomes prohibitive for many applications.

In the examples discussed above, there is one frequency component in S'(t) for each harmonic of interest in the input signal. However, depending on the particular LO signal utilized, some of the harmonics in the input signal may be represented by more than one harmonic in S'(t). That is, S'(t) may have more than N harmonics. The additional components can be ignored or utilized to provide an improved estimate of the amplitude and frequency of the corresponding harmonic in the input signal.

The manner in which any particular harmonic in the input signal is mapped to one or more harmonics in S'(t) by a particular LO signal can be ascertained by a calibration procedure. In one procedure, a calibration signal with a known complex frequency spectrum RFcal(f) is utilized as an input to the mixer. Denote the complex frequency spectrum of the output of the low pass filter when this calibration signal is used as input by IFcal(f). Denote the output complex frequency spectrum of the output of the low pass filter when the unknown signal is input to the mixer by IF(f). Then the complex frequency spectrum of the unknown signal, RF(f) is given by RF(f)=IF(f)*RFcal(f)/IFcal(f).

In the above-described embodiments, the number of harmonics of interest in the input signal is greater than the number of harmonics that are used to map the input harmonics into S'(t). However, embodiments in which the number of harmonics in the LO signal is greater than the number of harmonics of interest in the input signal can also be constructed.

The mixer utilized in the above-described embodiments of the present invention can be any conventional mixer that has the required frequency response. It should be noted that a sampling switch such as the type used in sampling oscilloscopes could also be utilized as a mixer in embodiments that utilize a multi-pulse signal. For the purposes of the present invention, a sampling switch will be defined to be any device that passes a signal when a control terminal on the device is at a first voltage and blocks the signal when the control terminal is at a second voltage. The multi-pulse signal discussed above is a signal that switches between two such voltages. A sampling switch with its control terminal connected to the multi-pulse signal can be used in place of the mixers discussed above. The control terminal serves as the LO input to which the multi-pulse is applied. The input signal is applied to the input of the switch, and the low pass filter is connected to the output of the switch.

The output of the sampling switch is the input signal multiplied by some constant factor when the switch is open and zero when the switch is closed. A mixer with an LO signal that switches between 0 and some constant non-zero potential likewise generates a signal that is the input signal multiplied by a constant when the LO signal is at the constant non-zero potential and zero when the LO signal is at 0. Hence, it can be seen that the mixer can be replaced by a switch if the LO signal is a multi-pulse signal. It should be noted that if the multi-pulse signal is replaced by an arbitrary repetitive signal, the output of the sampling switch can still be used to provide the IF signal in the present invention provided appropriate calibration measurements are made of the output of the sampling switch with known input signals.

It should also be noted that the above-described embodiments of the present invention have been described in terms of an "ideal" mixer; that is, a device receives an input signal and an LO signal and generates an output signal that is the product of the input signal and the LO signal. However, less than ideal mixing devices can also be utilized. Consider an input signal having a highest harmonic of interest, N, that is input to a circuit that receives an LO signal having M harmonics and generates an output signal, where M denotes the highest non-negligible harmonic in the LO. It will be presumed that there are M harmonics in the LO. Consider the $j^{th}$ harmonic of the input signal and denote the frequency of this harmonic by $^{in}\omega_j$. Similarly, denote the $m^{th}$ harmonic of the LO signal by $^{LO}\omega_m$. If, for each harmonic of interest in the input signal, the output signal has a corresponding frequency component $^{out}\omega_k$, where $^{out}\omega_k = |^{in}\omega_j - ^{LO}\omega_m|$ for some choice of j between 1 and N and m between 1 and M and the amplitude and phase of that frequency component can be written in terms of the amplitudes and phases of the harmonics of the LO signal and the harmonics of the input signal, than that circuit can be used in the present invention even if it provides additional frequency terms or the amplitudes of the output harmonics are not linear functions of the amplitudes of the input harmonics and amplitudes of the LO harmonics. For the purposes of the present discussion, the term "mixer" is defined to include such circuits. In particular, the term mixer includes a sampling switch as described above.

The above-described embodiments generate a signal S'(t) in which the frequency components of interest that leave the low-pass filter are equally spaced. In principle, the LO frequencies could be chosen such that these frequency components are not equally spaced. However, such embodiments require more complex data analysis, and hence, are not preferred.

It should be noted that while the input signal is presumed to have a highest harmonic of interest, N, one or more of the harmonics below N in the input signal could have zero amplitude. In this case, the corresponding harmonic in S'(t) will also have an amplitude of zero.

Various modifications to the present invention will become apparent to those skilled in the art from the foregoing description and accompanying drawings. Accordingly, the present invention is to be limited solely by the scope of the following claims.

What is claimed is:

1. An apparatus comprising:
   an LO signal generator that generates an LO signal;
   a mixer having a first port that receives a periodic input signal having harmonics including a highest harmonic of interest, N, said harmonics comprising a fundamental frequency $\omega_{in}$ and one or more higher frequency harmonics, each of said harmonics being characterized by an amplitude and phase, said mixer further comprising a local oscillator port that receives said LO signal and an output port that provides an IF signal;
   a low pass filter that filters said IF signal to generate a filtered IF signal; and
   an output device that outputs an output signal related to said filtered IF signal to a device external to said apparatus;
   wherein said filtered IF signal comprises a signal having frequency components including a frequency component having a frequency $\omega_c$ and one or more higher harmonics, each frequency component corresponding to one of said harmonics in said input signal and having an amplitude related to said amplitude of said corresponding harmonic in said input signal, wherein $\omega_c < \omega_{in}$, and wherein said LO signal comprises a periodic signal comprising a fundamental frequency $\omega_{LO}$ and one or more higher harmonics, wherein one of said harmonics in said LO signal has a phase that is different from another of said harmonics in said LO signal.

2. The apparatus of claim 1 wherein said harmonics of said LO signal have arbitrary amplitudes and phases.

3. The apparatus of claim 1 wherein at least one of the frequency components in said filtered IF signal differs in amplitude or phase from said corresponding frequency component in said input signal.

4. The apparatus of claim 1 wherein said output device comprises a signal sampler that samples said filtered IF signal at a frequency greater than $\omega_c$ and said signal sampler operates asynchronously with respect to said LO signal.

5. The apparatus of claim 1 wherein each of said higher frequency components of said filtered IF signal comprises a harmonic of $\omega_c$.

6. The apparatus of claim 5 wherein said low pass filter is characterized by cutoff frequency C and wherein $N\omega_c < C$, where $N\omega_{in}$ is the frequency of the highest harmonic of interest in said input signal.

7. The apparatus of claim 6 wherein said LO signal comprises M harmonics and M is less than or equal to N.

8. The apparatus of claim 5 further comprising a data processor that computes a Fourier transform of said filtered IF signal and determines said amplitude of one of said harmonics in said input signal.

9. The apparatus of claim 8 wherein said data processor generates a digital replica of said input signal and outputs that replica to a device external to said apparatus.

10. The apparatus of claim 8 wherein said data processor computes an amplitude and phase for each of said harmonics up to N in said input signal.

11. The apparatus of claim 8 wherein said data processor comprises calibration constants that specify a relationship between each harmonic in said filtered IF signal and said harmonics in said input signals.

12. The apparatus of claim 5 wherein said LO signal comprises a pattern of multiple pulses per period of the LO signal's fundamental frequency $\omega_{LO}$.

13. The apparatus of claim 12 wherein the amplitudes and phases of said LO signal's fundamental frequency $\omega_{LO}$ and one or more higher harmonics are adjusted by varying the pattern of multiple pulses.

14. The apparatus of claim 5 wherein said LO signal generator synchronizes said LO signal with a trigger signal.

15. The apparatus of claim 5 wherein said LO signal comprises a periodic signal having a plurality of harmonics comprising a fundamental, $\omega_{LO}$ and one or more higher harmonics and wherein said LO signal generator determines $\omega_{in}$ and sets $\omega_{LO}$ to provide a specific relationship between $\omega_{in}$ and $\omega_{LO}$.

16. A method for characterizing a periodic input signal having harmonics including a highest harmonic of interest, N, said harmonics comprising a fundamental having a frequency $\omega_{in}$ and one or more higher harmonics, said method comprising:
  generating a periodic LO signal having M harmonics comprising a fundamental frequency $\omega_{LO}$ and one or more harmonics;
  combining said LO signal with said input signal to create an IF signal; and
  filtering said IF signal to provide a frequency-compressed signal comprising a fundamental characterized by a frequency $\omega^c$ and one or more higher harmonics, each of said harmonics corresponding to one of said harmonics in said input signal and having an amplitude related to said amplitude of said corresponding harmonic in said input signal, wherein $\omega_c < \omega_{in}$, wherein at least one frequency component in said filtered IF signal differs in amplitude or phase from said corresponding frequency component in said input signal.

17. The method of claim 16 wherein said harmonics of said LO signal have arbitrary amplitudes and phases.

18. The apparatus of claim 16 wherein one of said harmonics in said LO signal has a phase that is different from another of said harmonics in said LO signal.

19. The method of claim 16 wherein said frequency-compressed signal comprises all frequency components in said IF signal with frequencies less than a cutoff frequency C and wherein $N\omega_c < C$.

20. The method of claim 16 further comprising determining an amplitude for one or more of said harmonics in said input signal.

21. The method of claim 16 wherein said LO signal comprises a multi-pulse signal.

22. A method for measuring a characteristic of a device under test [DUT] at a plurality of frequencies, said method comprising:
  coupling an input signal having harmonics including a highest harmonic of interest, N, said harmonics comprising a fundamental having a frequency $\omega_{in}$ and one or more higher harmonics to said DUT;
  receiving an output signal from said DUT
  combining said output signal with a periodic LO signal having a fundamental frequency related to $\omega_{in}$ to create a combined signal;
  low pass filtering said combined signal to provide a frequency-compressed signal comprising a fundamental characterized by a frequency $\omega_c$ and one or more higher harmonics, each of said harmonics corresponding to one of said harmonics in said input signal and having an amplitude related to said amplitude of said corresponding harmonic in said input signal, wherein $\omega_c < \omega_{in}$;
  measuring frequency components from said frequency-compressed signal; and
  applying calibration factors to said measured frequency components to determine said characteristic of said DUT at said harmonics of said input signal.

23. The method of claim 22 wherein at least one of said frequency components up to $N\omega_c$ in said filtered IF signal differs in amplitude or phase from said corresponding frequency component in said input signal.

24. The method of claim 22 wherein said calibration factors are determined by measuring said frequency components of said frequency-compressed signal when said DUT is replaced by a calibration device.

* * * * *

UNITED STATES PATENT AND TRADEMARK OFFICE
CERTIFICATE OF CORRECTION

PATENT NO. : 7,801,505 B2 Page 1 of 1
APPLICATION NO. : 11/848114
DATED : September 21, 2010
INVENTOR(S) : Gregory Douglas VanWiggeren et al.

It is certified that error appears in the above-identified patent and that said Letters Patent is hereby corrected as shown below:

In column 13, line 13, in Claim 16, delete "$\omega^c$" and insert -- $\omega_c$ --, therefor.

Signed and Sealed this

Sixteenth Day of November, 2010

David J. Kappos
*Director of the United States Patent and Trademark Office*